United States Patent [19]
Tomita

[11] Patent Number: 4,982,255
[45] Date of Patent: Jan. 1, 1991

[54] AVALANCHE PHOTODIODE

[75] Inventor: Akihisa Tomita, Tokyo, Japan

[73] Assignee: NEC Corporation, Tokyo, Japan

[21] Appl. No.: 437,562

[22] Filed: Nov. 17, 1989

[30] Foreign Application Priority Data

Nov. 18, 1988 [JP] Japan .................................. 63-291583

[51] Int. Cl.$^5$ ...................... H01L 27/14; H01L 27/12; H01L 29/161
[52] U.S. Cl. .......................................... 357/30; 357/4; 357/13; 357/16
[58] Field of Search ..................... 357/30 A, 16, 4 SL, 357/30 B, 30 E, 30 P, 4, 13

[56] References Cited
U.S. PATENT DOCUMENTS 4,684,969  8/1987  Taguchi .............................. 357/30 A
4,731,641  3/1988  Matsushima ....................... 357/30 A

FOREIGN PATENT DOCUMENTS 59-163878   9/1984  Japan ................................. 357/4 S L
60-260168  12/1985  Japan ................................. 357/30 A
 61-46080   3/1986  Japan ................................. 357/30 A
61-139078   6/1986  Japan ................................. 357/30 A
61-198688   9/1986  Japan ................................. 357/30 A Primary Examiner—Andrew J. James
Assistant Examiner—Ngan Van Ngo
Attorney, Agent, or Firm—Sughrue, Mion, Zinn, Macpeak and Seas

[57] ABSTRACT

An avalanche photodiode comprises an electron multiplication layer of superlattice including InAlAs mixed crystal layers which are lattice-matched with InP, and InGaAsP mixed crystal which are lattice-matched with InP and are provided with a bandgap energy of 1.0 eV to 1.2 eV at the room temperature. In the electron multiplication, a conduction band discontinuity is much greater than a valence band discontinuity to increase a ratio between ion densities $\alpha$ and $\beta$ for electron and hole, so that a noise level is decreased and a response characteristic is improved.

2 Claims, 2 Drawing Sheets

AVALANCHE PHOTODIODE

FIELD OF THE INVENTION

This invention relates to an avalanche photodiode and more particularly, to an avalanche photodiode which is applied to an optical communication system, and the like.

BACKGROUND OF THE INVENTION

A light receiving device which is utilized in an optical communication system is required to be of a high speed response, a high sensitivity, etc. An avalanche photodiode which has the highest sensitivity in receiving a light having a bit rate of approximately several Gb/s has been proposed. Such an avalanche photodiode is provided with an internal gain based on the avalanche multiplication, thereby meeting the requirements of the properties set forth above.

In the avalanche photodiode, it is required to select a material system having a small avalanche noise, so that a sensitivity is improved at a high speed response, because the sensitivity-characteristic depends largely on an avalanche multiplication process, in which carriers are ionized in accordance with the scattering thereof based on the acquisition of an energy approximately 1.5 times an energy gap in an electric field. More particularly, it is necessary to provide a large difference between ion densities $\alpha$ and $\beta$ of electron and hole in an avalanche multiplication layer of the avalanche photodiode, where the ion densities $\alpha$ and $\beta$ are defined by frequencies of the ionization of electrons and holes. If the ion density $\alpha$ is equal to the ion density $\beta$ ($\alpha=\beta$), wherein electrons and holes are excited with an equal provability, the chain reaction of ionization continues, so that a large random shot noise is produced.

A spectrum density $i_{NS}$ of a shot noise is defined by below equations, $$i_{NS}^2 = 2qI\, \Delta fM^3 \left[ 1 - (1 - \alpha/\beta)\left(1 - \frac{1}{M}\right)^2 \right] (\alpha < \beta)$$

$$i_{NS}^2 = 2qI\, \Delta fM^3 \left[ 1 - (1 - \beta/\alpha)\left(1 - \frac{1}{M}\right)^2 \right] (\beta < \alpha)$$

where q is a unit charge, I is an optical current, and M is a multiplication factor.

As understood from the above, a ratio ($\alpha/\beta$) of the electron ion density $\alpha$ and the hole ion density $\beta$ is defined to be a figure of merit, on which a noise characteristic of an avalanche photodiode depends.

Where Si is adopted for an avalanche photodiode of 0.8 $\mu$m wavelength band, the ratio ($\alpha/\beta$) is approximately 20, so that a high performance is obtained therein. On the contrary, an avalanche photodiode which is used at a wavelength band of 1.55 $\mu$m has the ratio ($\alpha/\beta$) of approximately 2, so that the reduction of a noise level is limited to some extent, because the avalanche photodiode includes a multiplication layer of InP.

Avalanche photodiodes which have been described on pages 467 and 468 of "Electronics Letters, 5th June 1980, Vol. 16, No.12" and on pages 597 to 599 of "Appl. Phys. Lett. 47(6), 15 Sept. 1985" include an electron multiplication layer of InGaAs/InAlAs superlattice, wherein the ratio ($\alpha/\beta$) has been proposed to be increased in accordance with a large discontinuity (approximately 0.5 eV) of conduction band between InGaAs and InAlAs. In other words, the ratio ($\alpha/\beta$) is increased in accordance with the contribution of the superlattice band-discontinuity to an ionization energy.

In an avalanche photodiode including a multiplication layer of superlattice, ion densities $\alpha$ and $\beta$ of the multiplication layer are defined by a below equation, $$\alpha,\beta = \frac{qE}{E_{i,th}} \exp\left[ 0.217\left(\frac{E_{i,th}}{E_R}\right)^{1.14} - \left\{4.217\left(\frac{E_{i,th}}{E_R}\right)\right\}^2 + \left(\frac{E_{i,th}}{qE\lambda}\right)^2 \right]$$

where $E_{i,th}$ is an ionization energy, $E_R$ is a phonon scattering energy, $\lambda$ is a mean free path in a phonon scattering process, and E is an electric field.

In the above equation, $$E_{i,th} = E_i^b{}_{,th} - \Delta E_c \text{ (for } \alpha\text{)}$$

$$E_{i,th} = E_i^b{}_{,th} - \Delta E_v \text{ (for } \beta\text{)}$$

where $\Delta E_c$ and $\Delta E_v$ are band discontinuities with respect to a conduction band and a valence band, respectively, provided that $E_i^b{}_{,th}$ is an ionization energy of a bulk.

As understood from the above equation, the ion densities $\alpha$ and $\beta$ are largely affected by the change of an ionization energy, because the ionization energy is included in the exponent of the equation. Therefore, it is required that the band discontinuity $\Delta E_c$ is largely greater or less than the band discontinuity $\Delta E_v$ ($\Delta E_c >> E_v$ or $\Delta E_c << \Delta E_v$), thereby increasing the ratio ($\alpha/\beta$). In considering a response characteristic, carriers which are avalanche-multiplied are desired to be of electrons each having a high mobility. In accordance with the assumption of "$\alpha > \beta$", the band discontinuity $\Delta E_c$ should be largely greater than the band discontinuity $\Delta E_v$, which is also desired to be zero ($\Delta E_v = 0$) to avoid the deterioration of a response characteristic due to holes, because the band discontinuity $\Delta E_v$ functions badly as a carrier trap for holes.

However, the proposed avalanche photodiodes have a disadvantage in that there is a difficulty in increasing the ratio ($\alpha/\beta$) at the electron multiplication layer, because a discontinuity, which is approximately 0.2 ev, exsists even in the valence band at the InGaAs/InAlAs superlattice. In addition, the valence band discontinuity of 0.2 ev results in the deterioration of a response characteristic, because it becomes a trap for holes.

SUMMARY OF THE INVENTION

Accordingly, it is an object of the invention to provide an avalanche photodiode in which noise is decreased.

It is a further object of the invention to provide an avalanche photodiode including an electron multiplication layer having a large ratio between ion densities $\alpha$ and $\beta$ for electron and hole.

It is a still further object of the invention to provide an avalanche photodiode in which a response characteristic is improved.

According to the invention, an avalanche photodiode includes an electron multiplication layer of superlattice which is composed of first layers and second layers alternately provided, wherein each of the first layers is an InAlAs mixed crystal lattice-matched with InP, and each of the second layers is an InGaAsP mixed crystal lattice-matched with InP and having a bandgap energy of 1.0 to 1.2 eV at the room temperature.

In order to increase the ratio of "$\alpha/\beta$" in an electron multiplication layer utilizing superlattice, it is required that a discontinuity of a conduction band is increased as much as possible, and that of a valence band is decreased to the maximum extent. A valence band energy $E_{v1}$ of an InAlAs mixed crystal lattice-matched with InP is positioned with respect to the summit of valence by 150 meV. On the other hand, a valence band energy $E_{v2}$ of an InGaAsP mixed crystal lattice-matched with InP is positioned by "$0.6 \times (E_{g1} - E_{g2})$", where $E_{g1}$ is a bandgap energy of InP, and $E_{g2}$ is a bandgap energy of InGaAsP. As the bandgap energy $E_{g2}$ of the InGaAsP mixed crystal changes from 0.75 eV (InGaAs) to 1.35 eV (InP), the valence band energy $E_{v2}$ of the InGaAsP mixed crystal can be changed from zero to 360 meV. Where the bandgap energy $E_{g2}$ ranges from 1.0 eV to 1.2 eV ($1.0$ eV$< E_{g2} < 1.2$ eV), a difference of the valence band energies $E_{v1}$ and $E_{v2}$ is less than 60 meV, so that the valence band discontinuity of InAlAs and InGaAsP can be small. In this case, a conduction band discontinuity is sufficiently large to be more than 320 meV. For this reason, the ratio of "$\alpha/\beta$" can be large in the provision of the electron multiplication layer of the superlattice including the first mixed crystal layers of InAlAs lattice-matched with InP, and the second mixed crystal layers of InGaAsP lattice-matched with InP and having the bandgap energy of 1.0 eV to 1.2 eV at the room temperature, which are formed alternately one layer on the other layer.

BRIEF DESCRIPTION OF THE DRAWINGS

The invention will be explained in more detail in conjunction with appended drawings, wherein.

DESCRIPTION OF THE PREFERRED EMBODIMENTS

Figure 1:
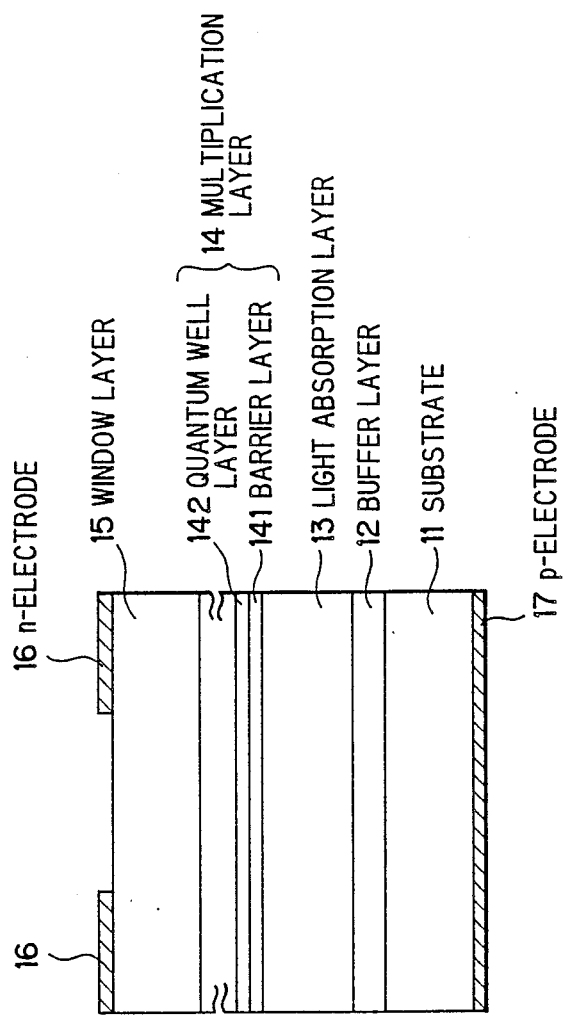
FIG. 1 is a schematic cross-sectional diagram showing an avalanche photodiode in a preferred embodiment according to the invention.

FIG. 1 shows an avalanche photodiode in the preferred embodiment according to the invention. The avalanche photodiode comprises a substrate 11 of P+-InP, and a buffer layer 12 of P-InP, which improves a crystal quality of layers grown thereon, having a thickness of 1.0 $\mu$m and doped with Zn to provide a carrier concentration of $2 \times 10^{17}$cm$^{-3}$, a light absorption layer 13 of undoped In$_{0.53}$Ga$_{0.47}$As having a thickness of 2 $\mu$m which absorbes light to generate electrons, a multiplication layer 14 for selectively multiplying electrons in accordance with an avalanche multiplication (to be explained in detail later), and a window layer 15 of undoped InP having a thickness of 2 $\mu$m through which light passes and which provides a pn junction successively grown on a first surface of the substrate 11. The avalanche photodiode further comprises an n-electrode 16 having a light aperture provided on a top surface of the window layer 15, and a p-electrode 17 provided on a second surface of the substrate 11. The aforementioned multiplication layer 14 has an energy discontinuity with respect to electrons, and includes a predetermined number of, for instance, fourty barrier layers 141 of In$_{0.53}$Al$_{0.47}$As each having a thickness of 10 nm, and fourty quantum well layers 142 of In$_{0.83}$Ga$_{0.17}$As$_{0.39}$P$_{0.61}$ each having a thickness of 10 nm, such that the fourty barrier and quantum well layers 141 and 142 are alternately provided one layer on the other layer.

In fabricating the avalanche photodiode described above, the buffer layer 12, the light absoption layer 13, the alternate barrier and quantum well layers 141 and 142, and the window layer 15 are successively grown on the substrate 11 by use of the organic metal vapor phase epitaxy. Then, Sn is doped into the window layer 15 to provide the pn junction by a density of $2 \times 10^{18}$cm$^{-3}$, and the ring shaped n-electrode 16 is provided on the window layer from an AuGeNi alloy. The substrate 11 is polished to have a thickness of 150 $\mu$m on the second surface, on which the p-electrode 17 is then provided from an AuZn alloy.

Figure 2:
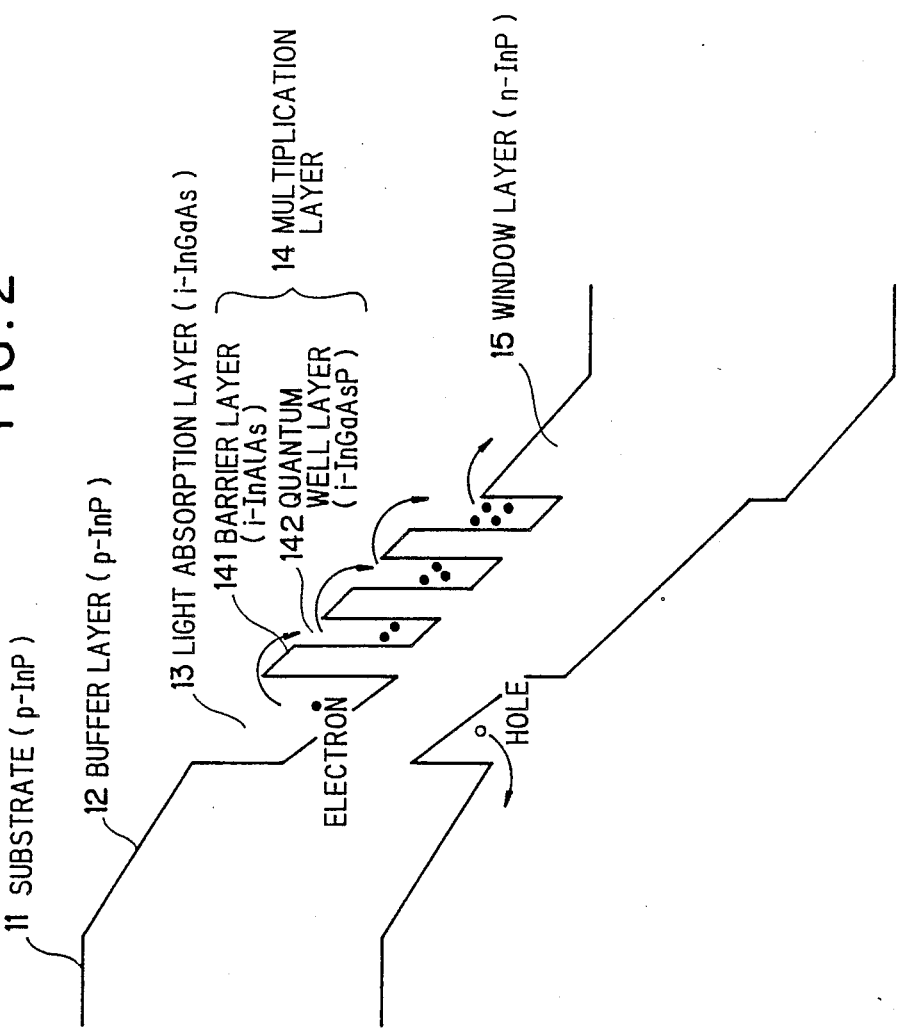
FIG. 2 is an explanatory diagram showing an energy level of the avalanche photodiode in the preferred embodiment.

In operation, a predetermined voltage, for instance, a voltage of 50 V is applied across the n- and p-electrodes 16 and 17 to generate an avalanche multiplication. An energy diagram of the preferred embodiment is shown in FIG. 2, wherein a bandgap energy of the quantum well 142 is 1.0 eV, and a conduction band discontinuity of the barrier layer 141 is 0.46 eV. On the other hand, a valence band discontinuity of the barrier layer 141 is zero. As a result, light which is passed through the window layer 15 and the electron multiplication layer 14 is absorbed in the light absorption layer 13 to generate electron and hole pairs, among which electrons are only injected into the electron multiplication layer 14, so that the ionization occurs with a high provability, because an effective ionization energy is decreased due to the large conduction band discontinuity. On the other hand, the increase of ionization can not occur for holes due to the lack of the valence band discontinuity, so that the avalanche multiplication of electrons becomes dominant to realize a low noise multiplication. Simultaneously, the valence band discontinuity does not exist in the preferred embodiment, so that holes are not trapped in the electron multiplication layer 14, thereby avoiding the deterioration of a response characteristic.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:
1. An avalanche photodiode, comprising:
   a substrate of InP;
   a light absorption layer for generating carriers provided over said substrate;
   an electron multiplication layer for realizing an avalanche multiplication provided over said substrate; and
   n- and p-electrodes for applying a predetermined voltage across said substrate, said light absorption layer, and said electron multiplication layer;
   wherein said electron multiplication layer is a superlattice structure and includes a predetermined number InAlAs mixed crystal layers which are lattice-matched InP and a predetermined number of InGaAsP mixed crystal layers which are lattice-matched with InP, said InGaAsP mixed crystal layers having a bandgap energy of 1.0 eV to 1.2 eV at room temperature.

2. An avalanche photodiode, comprising:
a substrate of InP;
a buffer layer provided on said substrate;
a light absorption layer for generating carriers provided on said buffer layer;
an electron multiplication layer having different bandgap energies for realizing an avalanche multiplication provided on said light absorption layer, each bandgap energy of said electron multiplication layer being larger than a bandgap energy of said light absorption layer;
a window layer provided on said electron multiplication layer;
P-electrode provided on a surface of said substrate opposite to said buffer layer; and
n-electrode provided on a surface of said window layer opposite to said multiplication layer;
wherein said electron multiplication layer is a superlattice structure and includes a predetermined number of InAlAs mixed crystal layers which are lattice-matched in InP and a predetermined number of InGaAsP mixed crystal layers which are lattice-matched with InP, said InGaAsP mixed crystal layers having a bandgap energy of 1.0 eV to 1.2 eV at room temperature.

* * * * *